(12) United States Patent
Jiang et al.

(10) Patent No.: US 10,763,235 B2
(45) Date of Patent: Sep. 1, 2020

(54) BATCH BONDING APPARATUS AND BONDING METHOD

(71) Applicant: SHANGHAI MICRO ELECTRONICS EQUIPMENT (GROUP) CO., LTD., Shanghai (CN)

(72) Inventors: Xiaoyu Jiang, Shanghai (CN); Hai Xia, Shanghai (CN); Feibiao Chen, Shanghai (CN); Song Guo, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/338,551

(22) PCT Filed: Sep. 26, 2017

(86) PCT No.: PCT/CN2017/103330
§ 371 (c)(1),
(2) Date: Apr. 1, 2019

(87) PCT Pub. No.: WO2018/059373
PCT Pub. Date: Apr. 5, 2018

(65) Prior Publication Data
US 2019/0385972 A1 Dec. 19, 2019

(30) Foreign Application Priority Data

Sep. 30, 2016 (CN) .......................... 2016 1 0876747

(51) Int. Cl.
*H01L 23/00* (2006.01)
*H01L 21/67* (2006.01)
*H01L 23/544* (2006.01)

(52) U.S. Cl.
CPC ........ *H01L 24/75* (2013.01); *H01L 21/67144* (2013.01); *H01L 23/544* (2013.01);
(Continued)

(58) Field of Classification Search
None
See application file for complete search history.

(56) References Cited

U.S. PATENT DOCUMENTS

2002/0168256 A1 11/2002 Fujisawa et al.
2004/0244915 A1 12/2004 Lam et al.
(Continued)

FOREIGN PATENT DOCUMENTS

CN 1983539 A 6/2007
CN 104051318 A 9/2014
(Continued)

OTHER PUBLICATIONS

Machine Translation of CN 104183527 (Year: 2015).*
Machine Translation of CN 102267208 (Year: 2015).*

*Primary Examiner* — J. E. Schoenholtz
(74) *Attorney, Agent, or Firm* — Muncy, Geissler, Olds & Lowe, P.C.

(57) ABSTRACT

A batch bonding apparatus and bonding method. The bonding apparatus comprises: a chip supply unit (10) for providing a chip (60) to be bonded; a substrate supply unit (20) for providing a substrate; a transfer unit (40) for transferring the chip (60) between the chip supply unit (10) and the substrate supply unit (20); and a pickup unit (30) disposed above the chip supply unit (10), for picking up the chip (60) from the chip supply unit (10) and uploading the chip (60) to the transfer unit (40) after flipping a marked surface of the chip (60) in a required direction. In the present invention pickup of each chip is completed individually, but transfer processes (Continued)

and bonding processes can be carried out for multiple chips at the same time, greatly increasing yield.

12 Claims, 4 Drawing Sheets

(52) U.S. Cl.
CPC .............. *H01L 24/81* (2013.01); *H01L 24/97* (2013.01); *H01L 2223/54426* (2013.01); *H01L 2224/7565* (2013.01); *H01L 2224/7598* (2013.01); *H01L 2224/75745* (2013.01); *H01L 2224/75822* (2013.01); *H01L 2224/8113* (2013.01); *H01L 2224/8117* (2013.01); *H01L 2224/951* (2013.01); *H01L 2224/95121* (2013.01)

(56) References Cited

U.S. PATENT DOCUMENTS

| | | |
|---|---|---|
| 2013/0167369 A1 | 7/2013 | Oh et al. |
| 2018/0033658 A1* | 2/2018 | Maijala ................. H05K 13/021 |
| 2018/0035582 A1* | 2/2018 | Murai .................. H05K 1/0269 |

FOREIGN PATENT DOCUMENTS

| | | |
|---|---|---|
| CN | 104157594 A | 11/2014 |
| CN | 104183527 A | 12/2014 |
| CN | 104241150 A | 12/2014 |
| JP | H11330109 A | 11/1999 |
| JP | 2001326251 A | 11/2001 |
| JP | 2005517289 A | 6/2005 |
| WO | WO-03/065783 A1 | 8/2003 |

\* cited by examiner

BATCH BONDING APPARATUS AND BONDING METHOD

TECHNICAL FIELD

The present application relates to the field of chip bonding, and in particular, to a batch bonding apparatus and method.

BACKGROUND

A chip bonding technique is an interconnection process which integrates chips onto a substrate. The chips to be processed are placed on a separation platform with their marks facing upwards. A robotic arm grabs the chips and flips them over, and then delivers them to the substrate for bonding. For a process requiring a long press-bonding time (about 30 seconds), the serial bonding process achieves a very low productivity because only one chip can be processed in a single bonding procedure, failing to meet the requirement of mass production. Moreover, there are two chip bonding techniques, i.e. bonding the chips to the substrate with their marks facing downwards and bonding the chips to the substrate with their marks facing upwards. An existing apparatus can only implement one kind of chip bonding processes, which further reduces the bonding productivity due to a complicated replacement of the apparatus.

SUMMARY OF THE INVENTION

The present application provides a batch bonding apparatus and method, so as to solve the problem of low productivity of chip bonding in the prior art.

To solve the foregoing technical problem, the present application provides a batch bonding apparatus, including:

a chip supply unit, configured to provide chips to be bonded;

a substrate supply unit, configured to provide a substrate;

a conveying unit, configured to transfer the chips between the chip supply unit and the substrate supply unit; and a pickup unit, disposed above the chip supply unit and configured to pick up each chip from the chip supply unit, and load the chip onto the conveying unit after flipping a mark surface of the chip to a required orientation.

Preferably, the pickup unit includes a first pickup assembly and a second pickup assembly, wherein the first pickup assembly is disposed above the chip supply unit, and includes a first rotating part and a first pickup head disposed on the first rotating part, wherein the second pickup assembly includes a second rotating part and a second pickup head disposed on the second rotating part, wherein the first pickup head picks up the chip from the chip supply unit and transfers the chip to the conveying unit or to the second pickup head.

Preferably, a rotational angle of each rotation of the first rotating part is 90° or 180°.

Preferably, the second pickup assembly further includes a first alignment part configured to identify a position of the chip on the second pickup head.

Preferably, there is one second pickup head, and the second pickup head is driven by the second rotating part to switch among an alignment position corresponding to the first alignment part, a handover position corresponding to the first pickup head, and a transfer position corresponding to the conveying unit.

Preferably, there are at least three second pickup heads, wherein the at least three second pickup heads are uniformly disposed on the second rotating part, and spaced apart from one another along a circumference of the second rotating part, and when the second rotating part stops rotation, three of the at least three second pickup heads are located at an alignment position corresponding to the first alignment part, a handover position corresponding to the first pickup head, and a transfer position corresponding to the conveying unit, respectively.

Preferably, an angle of each rotation of the second rotating part is equal to an angle between adjacent second pickup heads.

Preferably, the batch bonding apparatus further includes a fine tuning unit, wherein the fine tuning unit includes a second alignment part and a fine regulator, wherein the second alignment part scans a position of the chip on the conveying unit, and the fine regulator adjusts the position of the chip depending on a scanning result of the second alignment part.

Preferably, the conveying unit includes a guide rail, and a carrying platform mounted on the guide rail and being slidable along the guide rail, and the carrying platform is provided with a suction head for suction of the chips.

The present application also provides a batch bonding method, which is used with the foregoing batch bonding apparatus, and includes the following steps:

S1: loading a wafer having chips onto a chip supply unit, and loading a substrate onto a substrate supply unit;

S2: determining a required orientation of mark surfaces of the chips during bonding;

S3: if the mark surfaces are required to face downwards during bonding, picking up, by a pickup unit, the chips from the chip supply unit successively, rotating the chips 180° successively, and delivering the chips to a conveying unit which conveys all the chips to the substrate of the substrate supply unit to simultaneously bond all the chips to the substrate simultaneously; and S4: if the mark surfaces are required to face upwards during bonding, picking up, by a pickup unit the chips from the chip supply unit, flipping the chip over, and delivering the flipped chips to the conveying unit which conveys all the chips to the substrate of the substrate supply unit, to simultaneously bond all the chips to the substrate.

Preferably, step S3 and step S4 each further includes moving, by the conveying unit, a chip to a location above a fine tuning unit, and adjusting, by the fine tuning unit, the position of each of the chips on the conveying unit.

Preferably, the step of picking up, by the pickup unit, the chips from the chip supply unit and flipping the chips over in step S4 includes: picking up, by a first pickup assembly, the chips from the chip supply unit and transferring the chips to a second pickup assembly after rotating the chips by 90°; and loading, by the second pickup assembly, the chips onto the conveying unit.

Preferably, step S4 further includes: identifying, by a first alignment part, a position of the chips on the second pickup assembly, and then transferring the chips to the conveying unit in an aligned manner.

Compared with the prior art, the batch bonding apparatus and method provided in the present application have the following advantages:

1. In the present application, the pickup and accuracy adjustment of each chip is implemented separately, while the conveying process and bonding process of a plurality of chips are able to be completed simultaneously, thereby greatly improving the productivity and meeting the requirement of mass production.

2. According to the orientation requirement of the mark surfaces of the chips during bonding, the present application optionally uses a second pickup assembly, thereby enabling both cases that the chip is bonded with its mark surface facing upward and downward.

IN THE DRAWINGS

10—chip supply unit, 11—separation platform, 12—carrying disc, 20—substrate supply unit, 21—bonding platform, 22—carrying board, 30—pickup unit, 31—first rotating part, 32—first pickup head, 33—second rotating part, 34—second pickup head, 35—first alignment part, 40—conveying unit, 41—guide rail, 42—carrying platform, 50—fine tuning unit, 51—second alignment part, 52—fine regulator, 60—chip, and 61—mark surface

DETAILED DESCRIPTION

To make the objects, advantages and features of the present application more clear, the embodiments of the present invention will be described in greater detail below with reference to accompanying figures. It should be noted that the accompanying drawings are presented in a very simplified form and not necessarily presented to scale, with the only intention to facilitate convenience and clarity in explaining the object of the present application.

Figure 1:
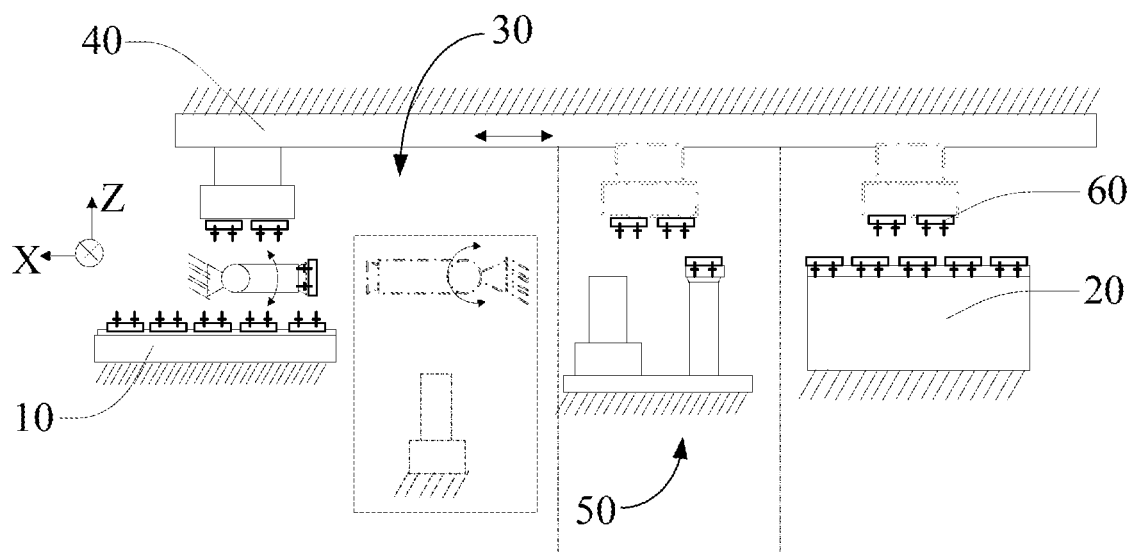
FIG. 1 is a schematic structural diagram of a batch bonding apparatus (requiring a chip bonded with its mark surface facing downward) according to an embodiment of the present application.
Figure 2:
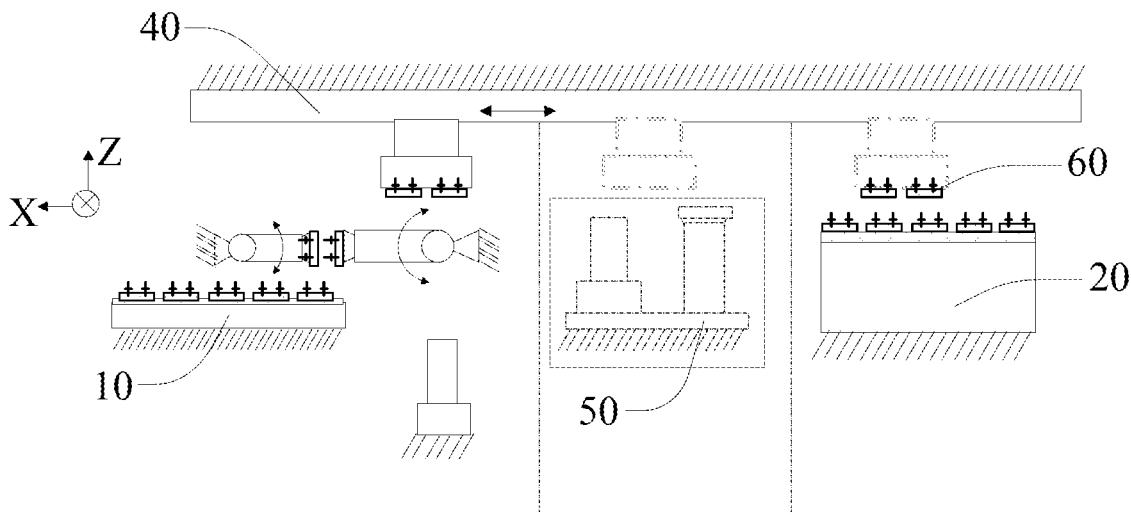
FIG. 2 is a schematic structural diagram of a batch bonding apparatus (requiring a chip bonded with its mark surface facing downward) according to an embodiment of the present application.
Figure 3:
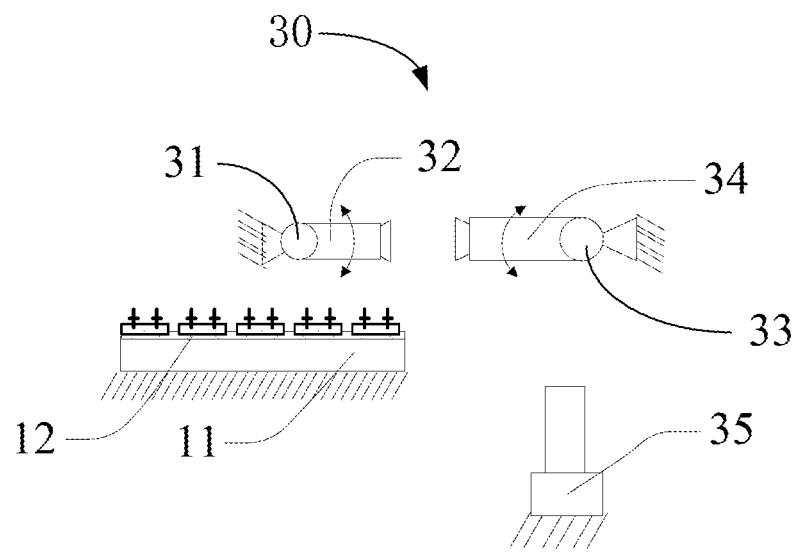
FIG. 3 is a schematic structural diagram of a pickup unit according to an embodiment of the present application.

As shown in FIG. 1 and FIG. 2, a batch bonding apparatus provided in the present application includes the following units:

A chip supply unit 10 is configured to separate a single chip 60 to be bonded from a wafer, and provides the chips 60 to be bonded to a pickup unit 30. Referring to FIG. 3, the chip supply unit 10 includes a separation platform 11 and a carrying disc 12 mounted on the separation platform 11. The carrying disc 12 is configured to carry the chips 60, and the separation platform 11 is able to drive the chips 60 to move horizontally.

Figure 5:
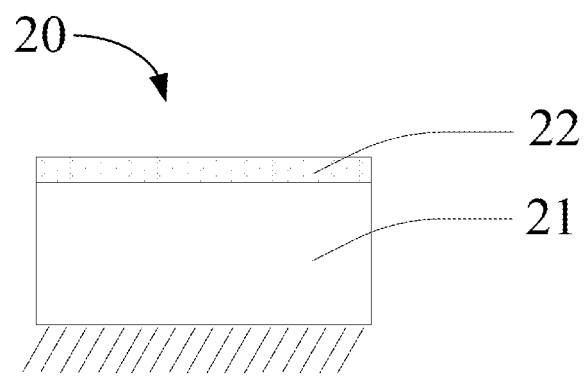
FIG. 5 is a schematic structural diagram of a substrate supply unit according to an embodiment of the present application.

A substrate supply unit 20 is configured to provide the substrate. Particularly referring to FIG. 5, the substrate supply unit includes a bonding platform 21 and a carrying board 22 mounted on the bonding platform 21. The carrying board 22 is configured to carry the substrate, and the bonding platform 21 is able to drive the substrate to move horizontally.

A conveying unit 40 is configured to convey the chips 60 between the chip supply unit 10 and the substrate supply unit 20.

Figure 7:
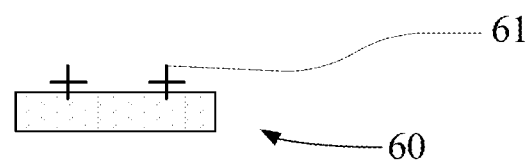
FIG. 7 is a schematic structural diagram of a chip according to an embodiment of the present application.

The pickup unit 30 is disposed above the chip supply unit 10 and configured to pick up each chip 60 from the chip supply unit 10, and loads the chip 60 onto the conveying unit 40 after flipping the mark surface 61 of the chip 60 to a required orientation, as shown in FIG. 7.

Specifically, in the present application, the pickup and accuracy adjustment of each chip 60 is implemented separately, while the conveying process and bonding process of a plurality of chips are able to be completed simultaneously, thereby greatly improving the productivity and meeting the requirement of the mass production. According to the orientation requirement of the mark surfaces 61 of the chips 60 during bonding, the present application optionally uses a second pickup assembly, thereby enabling both cases that the chip 60 is bonded with its mark surface 61 facing upward and downward.

Preferably, particularly referring to FIG. 3, the pickup unit 30 includes a first pickup assembly and a second pickup assembly. The first pickup assembly is disposed above the chip supply unit 10, and includes a first rotating part 31 and a first pickup head 32 disposed on the first rotating part 31. The second pickup assembly includes a second rotating part 33 and a second pickup head 34 disposed on the second rotating part 33. The first pickup head 32 picks up the chip 60 from the chip supply unit 10, and transfers the chip 60 to the conveying unit 40 or the second pickup head 34. Specifically, if it is not required to flip the chip over, the chip 60 is transferred to the conveying unit 40 by the first pickup head 32 directly. If it is required to flip the chip over, the first pickup head 32 transfers the chip 60 to the second pickup head 34 to flip the chip over, and then the second pickup head 34 delivers the chip 60 which is flipped over to the conveying unit 40. Preferably, the second pickup assembly further includes a first alignment part 35 configured to identify the position of the chip 60 on the second pickup head 34. The first alignment part 35 is disposed under the second rotating part 33. After the transfer from the first pickup head 32 to the second pickup head 34 is completed, the first alignment part 35 scans the position of the chip 60 on the second pickup head 34. Based on the position information, the second pickup head 34 is able to deliver the chip 60 to an accurate position of the conveying unit 40.

Preferably, continuously referring to FIG. 3, there is one second pickup head 34. The second pickup head 34 is driven by the second rotating part 33 to switch among an alignment position (where the second pickup head 34 faces the first alignment part 35) corresponding to the first alignment part 35, a handover position (where the second pickup head 34 faces the first pickup head 32) corresponding to the first pickup head 32, and a transfer position (where the second pickup head 34 faces the conveying unit 40) corresponding to the conveying unit 40. During the transfer, an rotational angle of each rotation of the first rotating part 31 is 90° or 180°, which guarantees the transfer accuracy and simplifies the device structure.

Figure 8:
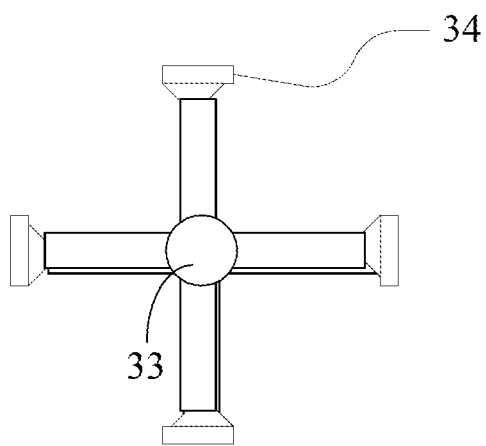
FIG. 8 is a schematic structural diagram of a second pickup head according to an embodiment of the present application.

Preferably, particularly referring to FIG. 8, there are a plurality of (the number is 4 in this embodiment) second pickup heads 34. The four second pickup heads 34 are uniformly disposed on the second rotating part 33, and spaced apart from one another along a circumference of the second rotating part, preferably spaced apart from one another in a uniform manner. When the second rotating part 33 stops rotation, three of the second pickup heads 34 are located at the alignment position corresponding to the first alignment part 35, the transfer position corresponding to the first pickup head 32, and the transfer position corresponding to the conveying unit 40, respectively. In this way, each second pickup head 34 is able to perform different operations at different work positions, improving the bonding efficiency. In this embodiment, the angle of each rotation of the second rotating part 33 is equal to the angle between adjacent second pickup heads 34. Also taking the four second pickup heads 34 as an example, the angle of each rotation of the second rotating part 33 is 90°.

Figure 4:
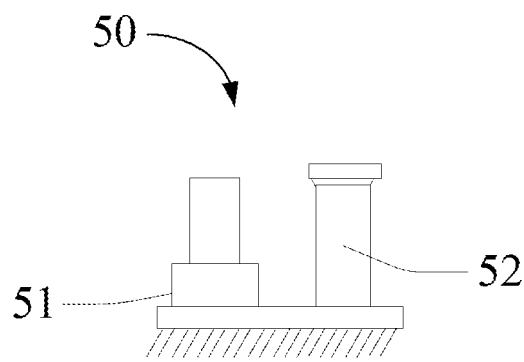
FIG. 4 is a schematic structural diagram of a fine tuning unit according to an embodiment of the present application.

Preferably, particularly referring to FIGS. 1 and 2, the batch bonding apparatus further includes a fine tuning unit 50. As shown in FIG. 4, the fine tuning unit 50 includes a second alignment part 51 and a fine regulator 52. The second alignment part 51 scans the position of the chip 60 on the conveying unit 40, and the fine regulator 52 adjusts the position of the chip 60 according to the scanning result of the second alignment part 51.

Figure 6:
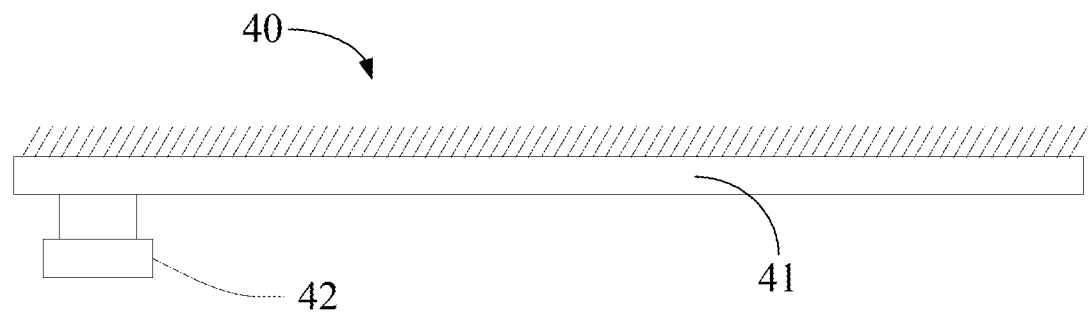
FIG. 6 is a schematic structural diagram of a conveying unit according to an embodiment of the present application.

Preferably, particularly referring to FIG. 6, the conveying unit 40 includes a guide rail 41, and a carrying platform 42 mounted on the guide rail 41 and being slidable along the guide rail 41. The carrying platform 42 is provided with a suction head (not shown in the figure), and the position and arrangement of the chips 60 on the suction head is able to be adjusted as required.

Particularly referring to FIGS. 1 and 2, the present application also provides a batch bonding method, which is used with the foregoing batch bonding apparatus, and includes the following steps:

S1: loading a wafer having chips 60 onto the chip supply unit 10, where the mark surfaces 61 of the chips 60 face upwards, and loading a substrate onto the substrate supply unit 20.

S2: determining a required orientation of the mark surfaces 61 of the chips 60 during bonding, i.e. requiring the mark surfaces 61 to face upwards or downwards during bonding.

S3: If the mark surfaces 61 are required to face downwards during bonding, as shown in FIG. 1, picking up, by the pickup unit 30, the chips 60 from the chip supply unit 10 successively, rotating the chips 60 by 180° successively, and then delivering the rotated chips to the conveying unit 40 till the number and arrangement of the chips 60 on the carrying platform 42 of the conveying unit 40 meet the requirements. The conveying unit 40 conveys all the chips 60 to the substrate of the substrate supply unit 20, to simultaneously bond all the chips 60 to the substrate.

S4: If the mark surfaces 61 are required to face upwards during bonding, as shown in FIG. 2, picking up, by the first pickup head 32, the chips 60 from the chip supply unit 10 and transferring the chips 60 to the second pickup head 34 to flip the chips 60 over. The step of picking up, by the pickup unit, the chips 60 from the chip supply unit 10 and flipping the chips 60 over in this step is: picking up, by the first pickup assembly, the chips 60 from the chip supply unit 10 and transferring the chips 60 to the second pickup assembly after rotating the chips 60 by 90°; and loading, by the second pickup assembly, the chips 60 onto the conveying unit 40, that is, sequentially conveying the chips 60, by the second pickup head 34, to the conveying unit 40. The conveying unit 40 conveys all the chips 60 to the substrate of the substrate supply unit 20, and all the chips 60 are bonded to the substrate simultaneously.

Figure 9:
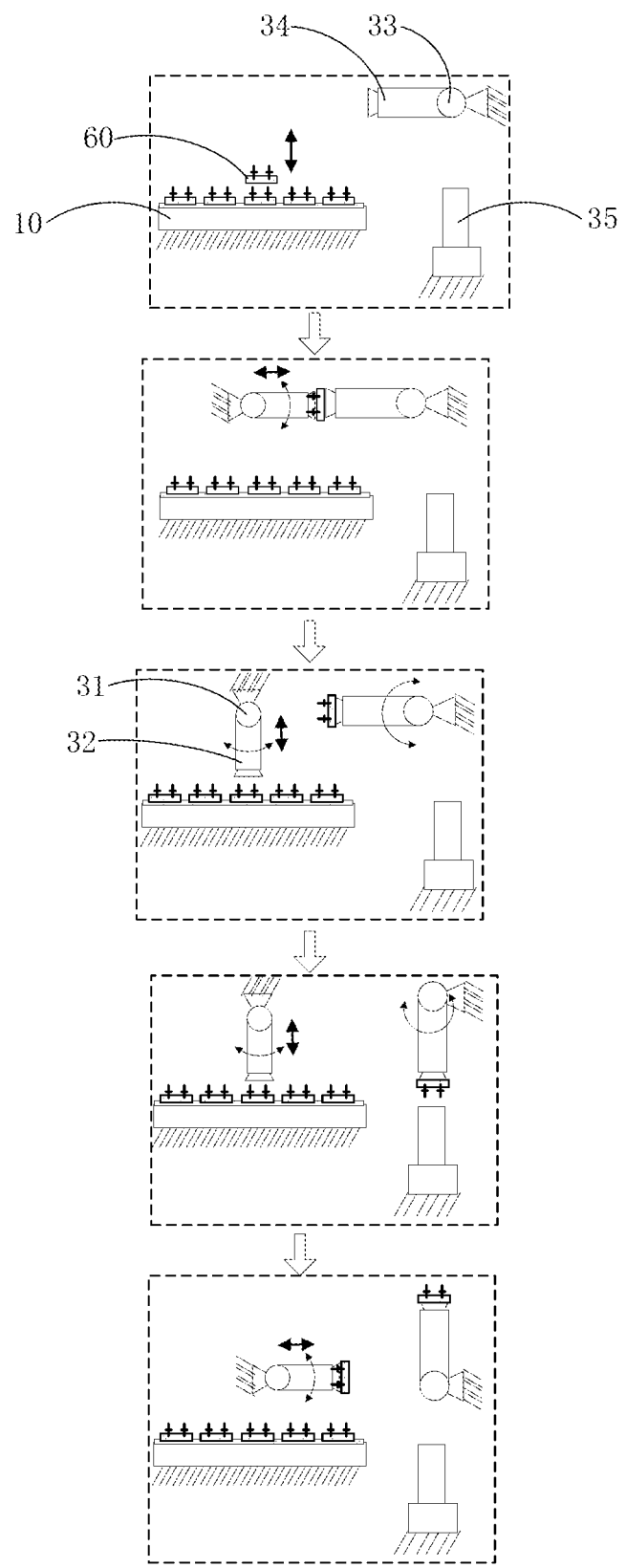
FIG. 9 is a schematic diagram of a transfer process between a first pickup assembly and a second pickup assembly when the mark surface of a chip is required to face upward during bonding according to an embodiment of the present application.

Referring to FIG. 9, when the mark surfaces 61 are required to face downwards during bonding, the first pickup head 32 stretches downwards to pick up one chip 60 from the chip supply unit 10; and then retracts back and rotates counterclockwise by 90° to transfer the chip 60 to the second pickup head 34. Afterwards, the first pickup head 32 rotates clockwise by 90° to pick up a next chip 60, and at the same time, the second pickup head 34 rotates to face the first alignment part 35 for position scanning. The first pickup head 32 rotates the second chip 60 to the position which supports the chip transfer to the second pickup head 34, to wait for the second pickup head 34 to pick up the chip. Simultaneously, the first chip 60 carried by the second pickup head 34 is accurately transferred to the conveying unit 40 according to the position information scanned by the first alignment part 35. In a similar vein, the delivery of the chips 60 from the chip supply unit 10 to the conveying unit 40 is completed.

Preferably, step S3 and step S4 each further includes: moving, by the conveying unit 40, the chips 60 to a location above the fine tuning unit 50, and adjusting, by the fine tuning unit 50, the position of each of the chips 60 on the conveying unit 40.

Specifically, in step S3, the conveying unit 40 moves the plurality of chips 60 to a location above the fine tuning unit 50 simultaneously, and the fine tuning unit 50 adjusts the position of each of the chips 60 on the conveying unit 40. Specifically, the second alignment part 51 scans each of the chips 60 on the carrying platform 42. After the second alignment part 51 completes scanning of the chip 60 and makes calculation, the fine tuning tool 52 takes down the chips 60 one by one from the carrying platform 42 and performs adjustment according to the scanning result of each of the chips 60. In addition, the carrying platform 42 performs horizontal adjustment according to the scanning result, such that the positions and angles of the chips 60 on the carrying platform 42 meet the requirements.

Step S4 further includes the following operation: identifying, by the first alignment part 35, the position of the chips 60 on the second pickup assembly, and then transferring the chips 60 to the conveying unit 40 in an aligned manner. Specifically, the chip 60 which is flipped over is moved to face the first alignment part 35, and the first alignment part 35 scans the chip mark and makes calculation. The carrying platform 42 moves to the right position according to the alignment result, and at the same time, the second pickup head 34 flips the chips 60 over and transfers the chips 60 to the carrying platform 42. During this procedure, since the first alignment part 35 has already precisely adjusted the position, it is unnecessary to use the fine tuning unit 50 to perform accuracy adjustment, thereby saving time and energy on the premise of guaranteeing the accuracy.

To sum up, in the batching bonding apparatus and method provided in the present application, the apparatus includes: a chip supply unit 10, configured to provide the chips 60 to be bonded; a substrate supply unit 20, configured to provide the substrate; a conveying unit 40, configured to transfer the chips 60 between the chip supply unit 10 and the substrate supply unit 20; and a pickup unit 30, disposed above the chip supply unit 10, and configured to pick up each chip 60 from the chip supply unit 10, and load the chip onto the conveying unit 40 after flipping the mark surface 61 of the chip 60 to a required orientation. In the present application, the pickup and accuracy adjustment of each of the chips 60 is implemented separately, while the conveying process and bonding process of a plurality of chips 60 are able to be completed simultaneously, thereby greatly improving the productivity. According to the orientation requirement of the mark surfaces 61 of the chips 60 during bonding, the present application optionally uses the flipping mechanism and implements the operation steps, thereby enabling both cases that the chip is bonded with its mark surface 61 facing upward and downward.

Apparently, persons skilled in the art can make various changes and modifications to the present application without departing from the spirit and scope of the present application. Thus, if such modifications and variations to the present application fall within the scope of the appended claims and the equivalent technology, the present application is also intended to embrace these modifications and variations.

What is claimed is:

1. A batch bonding apparatus, comprising:
   a chip supply unit, configured to provide chips to be bonded;
   a substrate supply unit, configured to provide a substrate;
   a conveying unit, configured to transfer the chips between the chip supply unit and the substrate supply unit; and
   a pickup unit, disposed above the chip supply unit and configured to, pick up each chip from the chip supply unit and load the chip onto the conveying unit after flipping a mark surface of the chip to a required orientation,
   wherein the pickup unit comprises a first pickup assembly and a second pickup assembly, wherein the first pickup assembly is disposed above the chip supply unit, and comprises a first rotating part and a first pickup head disposed on the first rotating part, wherein the second pickup assembly comprises a second rotating part and a second pickup head disposed on the second rotating part, wherein the first pickup head picks up the chip from the chip supply unit and transfers the chip to the conveying unit or to the second pickup head.

2. The batch bonding apparatus of claim 1, wherein a rotational angle of each rotation of the first rotating part is 90° or 180°.

3. The batch bonding apparatus of claim 1, wherein the second pickup assembly further comprises a first alignment part configured to identify a position of the chip on the second pickup head.

4. The batch bonding apparatus of claim 3, wherein there is one second pickup head, and the second pickup head is driven by the second rotating part to switch among an alignment position corresponding to the first alignment part, a handover position corresponding to the first pickup head, and a transfer position corresponding to the conveying unit.

5. The batch bonding apparatus of claim 3, wherein there are at least three second pickup heads, wherein the at least three second pickup heads are uniformly disposed on the second rotating part and spaced apart from one another along a circumference of the second rotating part, and when the second rotating part stops rotation, three of the at least three second pickup heads are located at an alignment position corresponding to the first alignment part, a handover position corresponding to the first pickup head, and a transfer position corresponding to the conveying unit, respectively.

6. The batch bonding apparatus of claim 5, wherein an angle of each rotation of the second rotating part is equal to an angle between adjacent second pickup heads.

7. The batch bonding apparatus of claim 1, wherein the batch bonding apparatus further comprises a fine tuning unit, wherein the fine tuning unit comprises a second alignment part and a fine regulator, wherein the second alignment part scans a position of the chip on the conveying unit, and the fine regulator adjusts the position of the chip depending on a scanning result of the second alignment part.

8. The batch bonding apparatus of claim 1, wherein the conveying unit comprises a guide rail and a carrying platform mounted on the guide rail and being slidable along the guide rail, and the carrying platform is provided with a suction head for suction of the chips.

9. A batch bonding method, used with the batch bonding apparatus according to claim 1, and comprising the following steps:
   S1: loading a wafer having chips onto a chip supply unit, and loading a substrate onto a substrate supply unit;
   S2: determining a required orientation of mark surfaces of the chips during bonding;
   S3: if the mark surfaces are required to face downwards during bonding, picking up, by a pickup unit, the chips from the chip supply unit successively, rotating the chips by 180° successively, and delivering the rotated chips to a conveying unit which conveys all the chips to the substrate of the substrate supply unit to simultaneously bond all the chips to the substrate; and
   S4: if the mark surfaces are required to face upwards during bonding, picking up, by a pickup unit, the chips from the chip supply unit, flipping the chips over, and delivering the chips to the conveying unit which conveys all the chips to the substrate of the substrate supply unit to simultaneously bond all the chips to the substrate.

10. The batch bonding method of claim 9, wherein step S3 and step S4 each further comprises: moving, by the conveying unit, the chips to a location above a fine tuning unit, and adjusting, by the fine tuning unit, a position of each of the chips on the conveying unit.

11. The batch bonding method of claim 9, wherein the step of picking up, by the pickup unit, the chips from the chip supply unit and flipping the chips over in step S4 comprises: picking up, by the first pickup assembly, the chips from the chip supply unit and transferring the chips to the second pickup assembly after rotating the chips by 90°; and loading, by the second pickup assembly, the chips onto the conveying unit.

12. The batch bonding method of claim 11, wherein step S4 further comprises: identifying, by a first alignment part, a position of the chips on the second pickup assembly, and then transferring the chips to the conveying unit in an aligned manner.

* * * * *